United States Patent
Or-Bach

(10) Patent No.: US 10,930,608 B2
(45) Date of Patent: *Feb. 23, 2021

(54) 3D SEMICONDUCTOR DEVICE AND STRUCTURE

(71) Applicant: Monolithic 3D Inc., San Jose, CA (US)

(72) Inventor: Zvi Or-Bach, San Jose, CA (US)

(73) Assignee: MONOLITHIC 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/019,162

(22) Filed: Sep. 11, 2020

(65) Prior Publication Data

US 2020/0411459 A1    Dec. 31, 2020

Related U.S. Application Data

(63) Continuation-in-part of application No. 16/907,234, filed on Jun. 20, 2020, now Pat. No. 10,825,779, which is a continuation-in-part of application No. 16/450,728, filed on Jun. 24, 2019, now Pat. No. 10,777,540, which is a continuation-in-part of application No. 15/632,325, filed on Jun. 24, 2017, now Pat. No. 10,381,328, which is a continuation-in-part of application No. 15/095,187, filed on Apr. 11, 2016, now Pat. No. 9,721,927.

(60) Provisional application No. 62/149,651, filed on Apr. 19, 2015.

(51) Int. Cl.
*H01L 23/02* (2006.01)
*H01L 21/00* (2006.01)
*H01L 23/00* (2006.01)
*H01L 25/065* (2006.01)
*H01L 25/18* (2006.01)
*H01L 23/544* (2006.01)

(52) U.S. Cl.
CPC ............ *H01L 24/08* (2013.01); *H01L 23/544* (2013.01); *H01L 25/0657* (2013.01); *H01L 25/18* (2013.01); *H01L 2223/54426* (2013.01); *H01L 2224/0224* (2013.01); *H01L 2224/08145* (2013.01); *H01L 2924/1431* (2013.01); *H01L 2924/1434* (2013.01)

(58) Field of Classification Search
CPC .......................... H01L 23/544; H01L 25/0657
USPC .................................. 438/108, 109; 257/686
See application file for complete search history.

(56) References Cited

U.S. PATENT DOCUMENTS

| 6,507,115 B1 * | 1/2003 | Hofstee | H01L 23/3677 257/685 |
| 9,721,927 B1 * | 8/2017 | Or-Bach | H01L 27/0688 257/686 |
| 10,381,328 B2 * | 8/2019 | Or-Bach | H01L 25/0652 257/686 |

* cited by examiner

Primary Examiner — Calvin Lee
(74) Attorney, Agent, or Firm — Patent Law Office; Bao Tran

(57) ABSTRACT

A 3D semiconductor device, the device including: a first die including first transistors and first interconnect; and a second die including second transistors and second interconnect, where the first die is overlaid by the second die, where the first die has a first die area and the second die has a second die area, where the first die area is at least 10% larger than the second die area, where the second die is pretested, where the second die includes an array of memory cells, where the first die includes control logic to control reads and writes to the array of memory cells, where the second die is bonded to the first die, and where the bonded includes hybrid bonding.

17 Claims, 7 Drawing Sheets

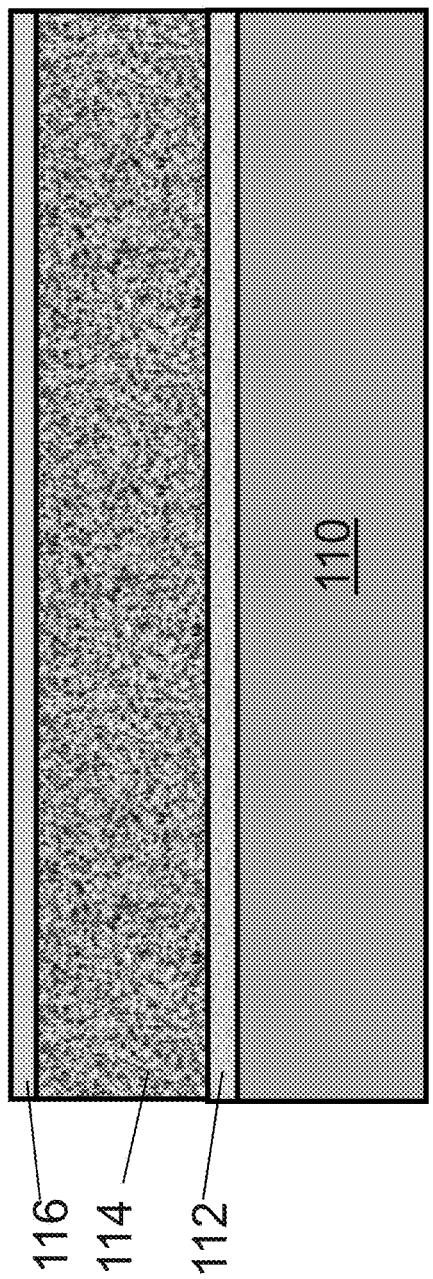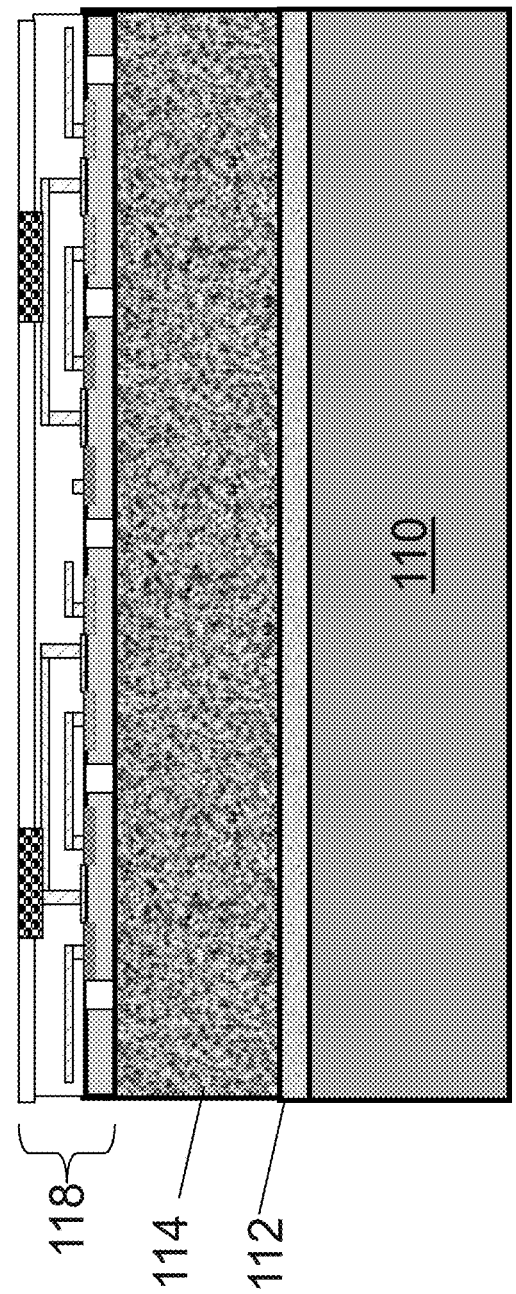

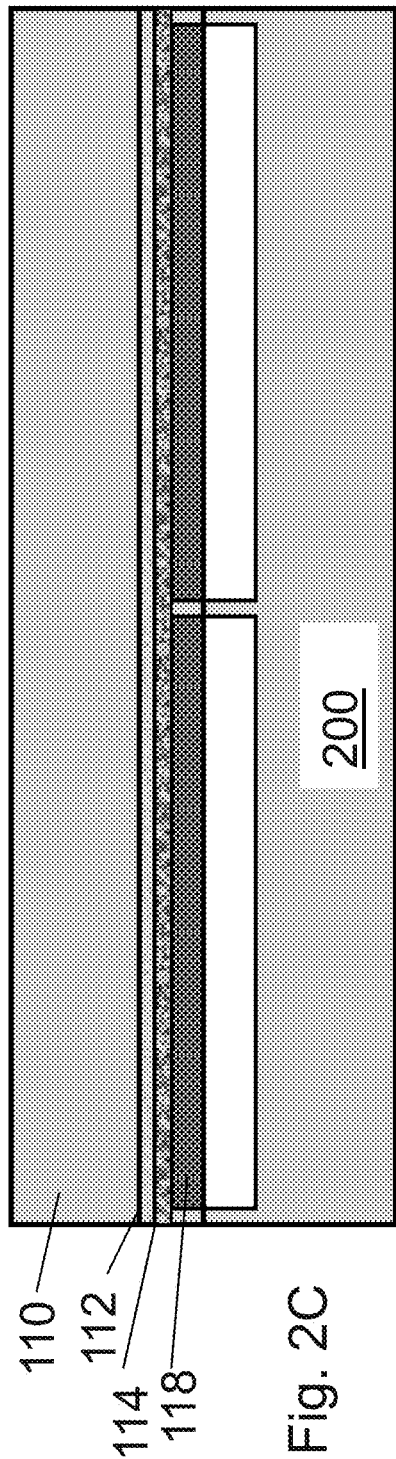
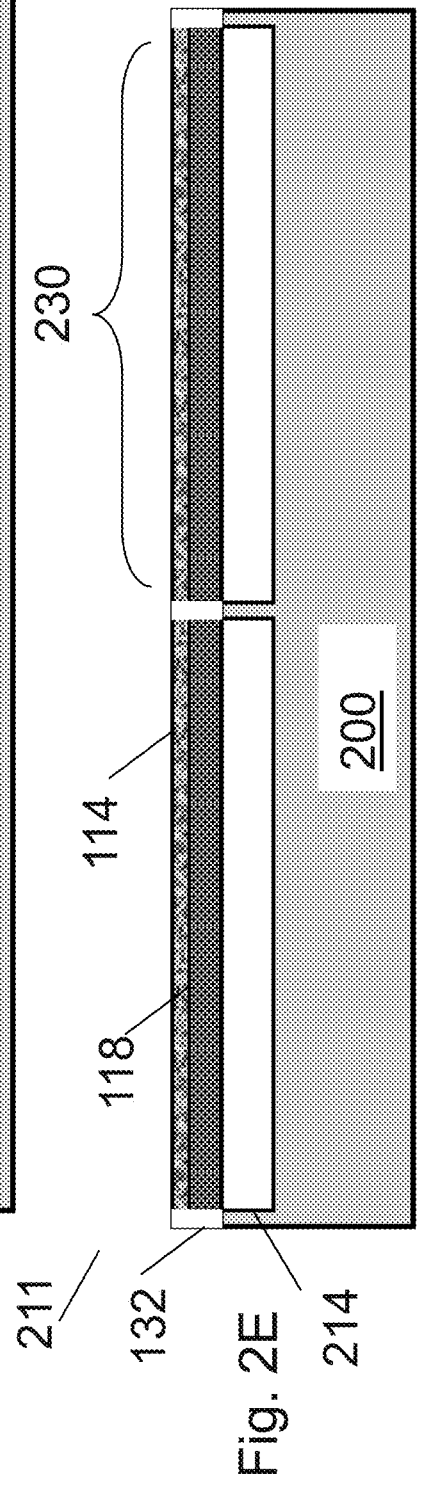
Fig. 2C
Fig. 2D
Fig. 2E

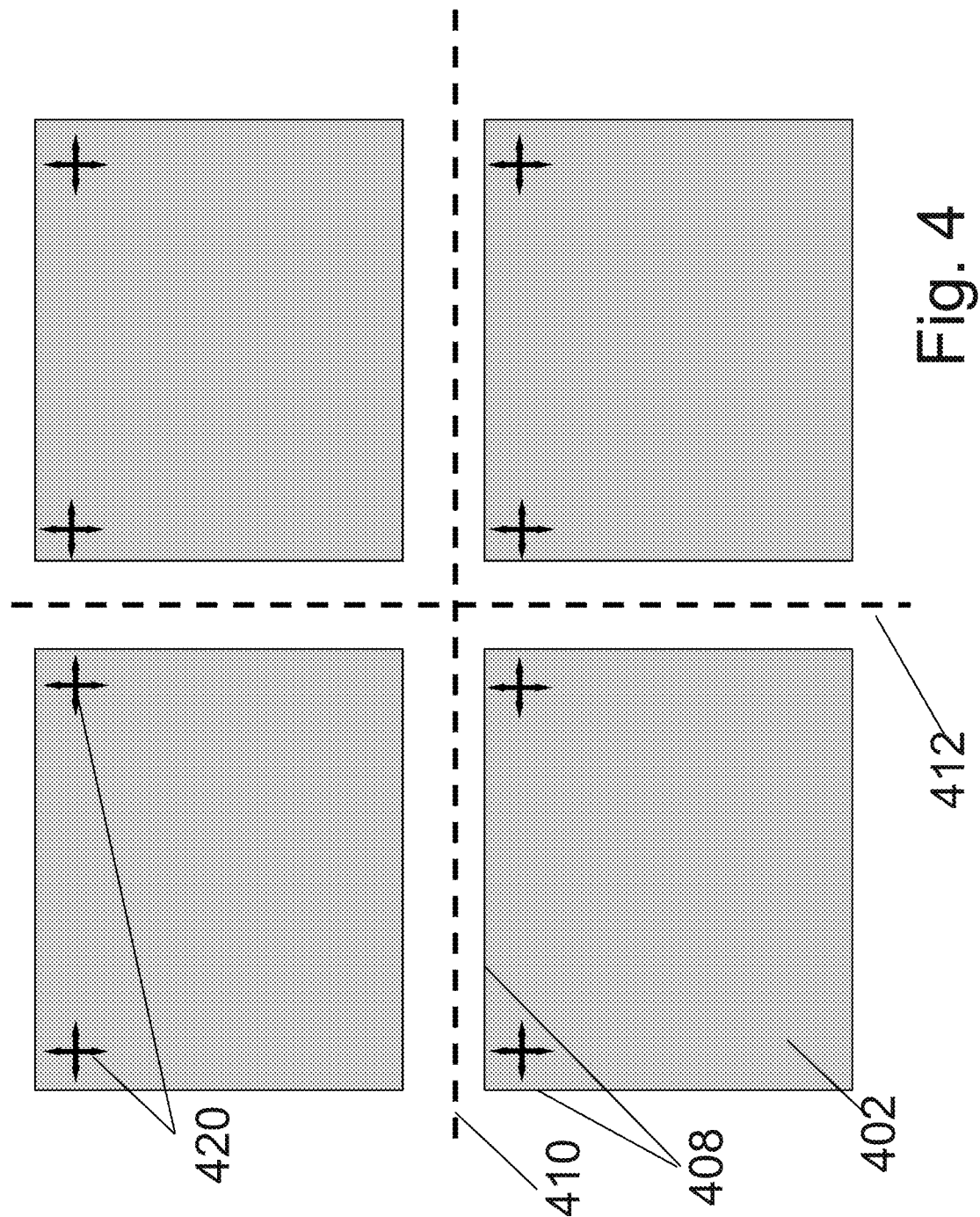

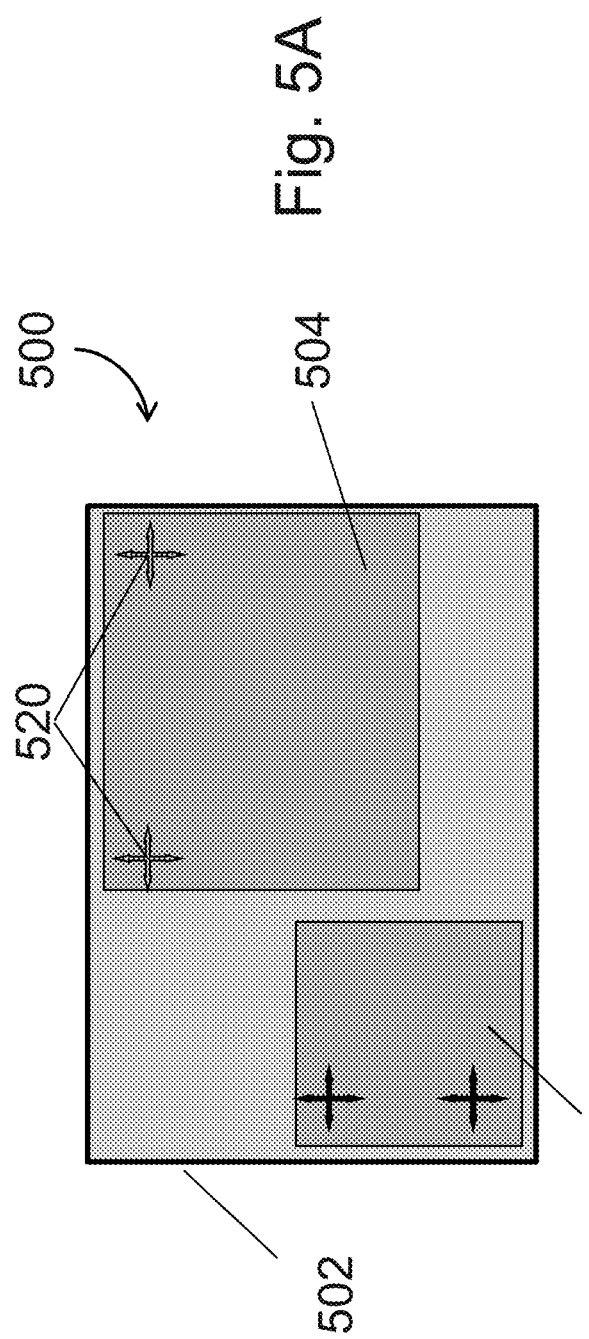
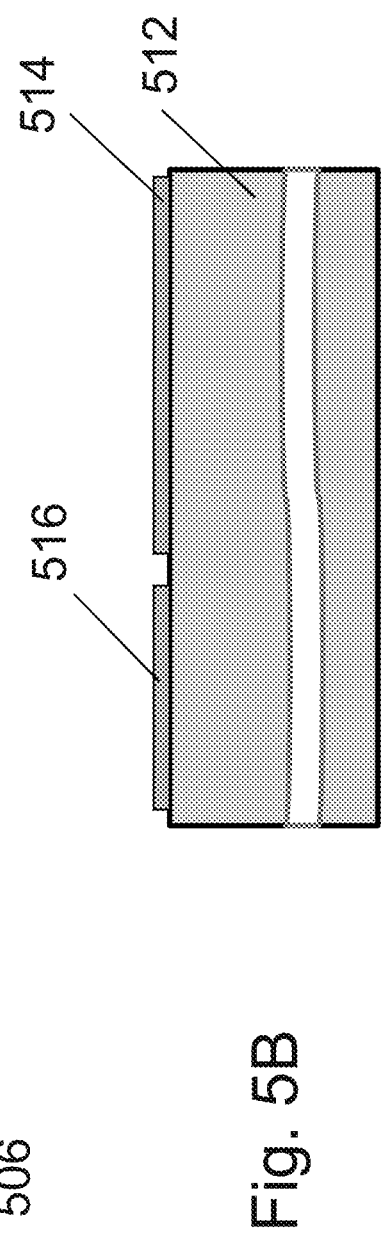
Fig. 5A
Fig. 5B

3D SEMICONDUCTOR DEVICE AND STRUCTURE

CROSS-REFERENCE TO RELATED APPLICATIONS

This application is a continuation-in-part application of U.S. patent application Ser. No. 16/907,234, which was filed on Jun. 20, 2020 (now U.S. Pat. No. 10,825,779 issued on Nov. 3, 2020), which is a continuation-in-part application of U.S. patent application Ser. No. 16/450,728, which was filed on Jun. 24, 2019 (now U.S. Pat. No. 10,777,540 issued on Sep. 15, 2020), which is a continuation-in-part application of U.S. patent application Ser. No. 15/632,325, which was filed on Jun. 24, 2017 (now U.S. Pat. No. 10,381,328 issued on Aug. 13, 2019), which is a continuation-in-part application of U.S. patent application Ser. No. 15/095,187, which was filed on Apr. 11, 2016 (now U.S. Pat. No. 9,721,927 issued on Aug. 1, 2017), which claims benefit of provisional U.S. Patent Application No. 62/149,651, filed on Apr. 19, 2015. The entire contents of the foregoing applications are incorporated herein by reference.

BACKGROUND OF THE INVENTION

1. Field of the Invention

This application relates to the general field of Integrated Circuit (IC) devices, fabrication methods, and die bonding and die stacking devices and methods, and more particularly to multilayer or Three Dimensional Integrated Circuit (3D-IC) devices, fabrication methods, and die bonding and die stacking devices and methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:
  Through-silicon via (TSV) technology: Multiple layers of transistors (with or without wiring levels) can be constructed separately. Following this, they can be bonded to each other and connected to each other with through-silicon vias (TSVs).
  Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318; and pending U.S. patent application Publications and applications, Ser. Nos. 14/642,724, 15/150,395, 15/173,686, 62/651,722; 62/681,249, 62/713,345, 62/770,751, 62/952,222, 2020/0013791, 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031 and 9,941,319. The entire contents of the foregoing patents, publications, and applications are incorporated herein by reference.

In addition, the entire contents of U.S. Pat. Nos. 9,721,927, 10,381,328, 10,777,540, U.S. patent application publication 2019/0312014 and U.S. patent application Ser. No. 16/907,234, 62/149,651 are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: "[0034] Among the technologies to form the detaching layer, one of the well known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175,652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and longtime should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . ."

In at least one embodiment presented herein, at least one innovative method and device structure to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al. and "High Performance Heat Sinking for VLSI," IEEE Electron Device Letters, vol. EDL-2, No. 5, May 1981, by D. B. Tuckerman and R. F. W. Pease.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

In addition, thermal limitations during IC fabrication have been a big obstacle on the road to monolithic three-dimensional ICs. The semiconductor and microelectronic processing techniques to form transistors, circuits, and devices, for example to form some silicon oxides or nitrides, repair damages from processes such as etching and ion-implantation, annealing and activation of ion implanted species, and epitaxial regrow techniques, have processing temperatures (for example, greater than 400° C.) and times at temperature that would damage and harm the underlying metallization and/or device layers and structures. These processes may involve transient (short timescales, such as less than 500 ns short wavelength laser pulses) heat exposures to the wafer being processed, or steady state applications (such as RTA, RTO, spike, flash, CVD, ALD) of heat and/or heated material or gases that may have processing times of seconds, minutes, or hours.

Techniques to remove heat from 3D Integrated Circuits and Chips and protect sensitive metallization and circuit elements from either the heat of processing of the 3D layers or the operationally generated heat from an active circuit, will be beneficial.

There are many advantages to constructing a 3D IC system using die to wafer integration, such as, for example, as presented in U.S. patent application Ser. No. 14/642,724 with respect to at least FIGS. 44A-B and FIGS. 45A-C. A severe limitation in respect to such die to wafer integration is the throughput of such processing and its implication on the end 3D device cost. Herein we seek to present alternative process flows to support higher throughput and lower cost for such die to wafer integration including processes to allow ultra-thin die which further reduces cost and increases integration.

Additionally the 3D technology according to some embodiments of the invention may enable some very innovative IC devices alternatives with reduced development costs, novel and simpler process flows, increased yield, and other illustrative benefits.

SUMMARY

The invention may be directed to multilayer or Three Dimensional Integrated Circuit (3D IC) devices, fabrication methods, and die bonding and die stacking devices and methods.

In one aspect, a 3D semiconductor device, the device comprising: a first die comprising first transistors and first interconnect; and a second die comprising second transistors and second interconnect, wherein said first die is overlaid by said second die, wherein said first die has a first die area and said second die has a second die area, wherein said first die area is at least 10% larger than said second die area, wherein said second die is pretested, wherein said second die comprises an array of memory cells, wherein said first die comprises control logic to control reads and writes to said array of memory cells, wherein said second die is bonded to said first die, and wherein said bonded comprises hybrid bonding.

In another aspect, a 3D semiconductor device, the device comprising: a first die comprising first transistors and first interconnect; and a second die comprising second transistors and second interconnect, wherein said first die is overlaid by said second die, wherein said first die is sourced from a first wafer with a first diameter greater than 280 mm and said second die is sourced from a second wafer with a second diameter less than 240 mm, wherein said second die is bonded to said first die, wherein said bonded comprises hybrid bonding, wherein second die comprises an array of memory cells, and wherein said first die comprises control logic to control reads and writes to said array of memory cells.

In another aspect, a 3D semiconductor device, the device comprising: a first die comprising first transistors and first interconnect; and a second die comprising second transistors and second interconnect, wherein said first die is overlaid by said second die, wherein said first die has a first die area and said second die has a second die area, wherein said first die area is at least 10% larger than said second die area, wherein said second die is bonded to said first die, wherein said bonded comprises hybrid bonding, wherein second die comprises an array of memory cells, and wherein said first die comprises control logic to control reads and writes to said array of memory cells.

BRIEF DESCRIPTION OF THE DRAWINGS

Various embodiments of the invention will be understood and appreciated more fully from the following detailed description, taken in conjunction with the drawings in which:

FIGS. 1A and 1B are exemplary illustrations of a processed wafer;

FIGS. 2A-2E are exemplary illustrations of a process flow for die to wafer manufacturing;

FIG. 4 is an exemplary illustration of an exemplary 4 dice with streets and alignment marks/structures; and FIGS. 5A and 5B are exemplary illustrations of a 3D semiconductor device.

DETAILED DESCRIPTION

Figure 1C:
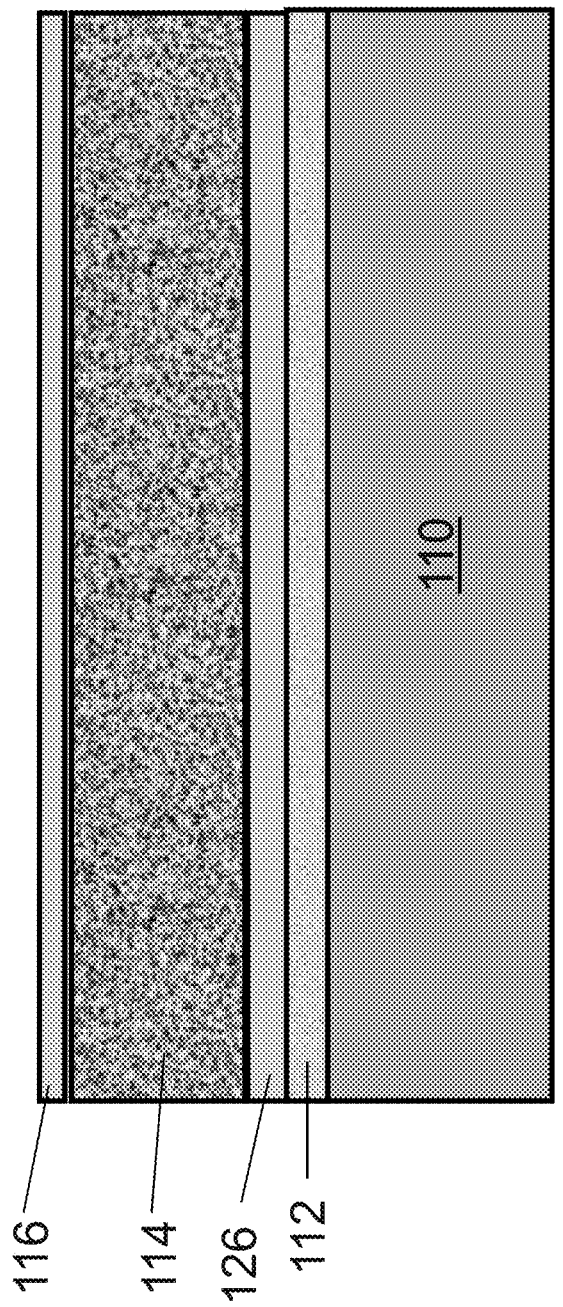
FIG. 1C is an exemplary illustration of a processed wafer with an added layer.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices or die bonding and die stacking devices and methods. The process flows, which may be a sequence of steps for building a device or die bonding and die stacking devices and methods, may have many structures, numerals and labels that may be common between two or more adjacent steps. In such cases, some labels, numerals and structures used for a certain step's figure may have been described in the previous steps' figures.

There are many advantages to constructing a 3D IC system using die to wafer integration. A severe limitation in respect to such die to wafer integration is the throughput of such processing and its implication on the end 3D device cost. Herein we seek to present alternative process flows to support higher throughput and lower cost for such die to wafer integration including processes to allow ultra-thin die which further reduces cost and increases integration.

It is known in the art that die to wafer processing could be done with dies having thickness of less than about 20 micron to about a die thickness of about 6 micron. Such has been presented in a paper by Christine Harendt, Evangelos A. Angelopoulos, Stefan Endler, Mahadi-Ul Hassan, Tu Hoang, Joachim N. Burghartz, "Mechanical Stability of Ultra-thin Chips down to 6 µm," in Forum 'be-flexible' 2010, 11th International Workshop, Munich, Germany, (Vortrag), Vorträge nur für Teilnehmer, Dec. 1, 2010 (2010); and a paper by Saleh Ferwana, et al., "Self-Aligned Through Silicon Vias in Ultra-Thin Chips for 3D-Integration," Proc. of 4th Electronics System Integration Technology Conferences (ESTC), Amsterdam, Netherlands, (Vortrag), 2012, both incorporated herein by reference. As well, in the book *Ultra-thin Chip Technology and Applications*, Joachim N. Burghartz, ed. Berlin, Germany: Springer, December, 2010, ISBN: 978-1-4419-7275-0, p. 467 (2010), incorporated herein by reference. Additionally, in U.S. Pat. Nos. 8,466,037 and 7,951,691, both incorporated herein by reference.

As illustrated in FIG. 1A, a wafer, such as a silicon substrate, may be processed to support a die to wafer 3D process flow. Using processes described in U.S. patent application Ser. No. 14/642,724, in at least FIGS. 22-24, a base wafer 110 may be processed to construct a top high quality epitaxial layer 116 for future device layers on top of a relatively thick low porosity layer 114. Low porosity layer 114 may have less than 50% porous structure and even about 20% porosity and would have thickness of less than 20 micron or even with die thickness of about 6 micron. Underneath low porosity layer 114 a high porosity layer 112 may be constructed to support future 'cut' or 'cleave' for a layer transfer as was previously presented in at least U.S. patent application Ser. No. 14/642,724. Epitaxial layer 116 could be grown to a few nm thick layer, for example, such as 5 nm or 10 nm, to a moderately thick layer, such as, for example, 100 nm or 200 nm, to a relatively thick layer, such as, for example, 1 micron, or 3 microns thick.

The low porosity layer 114 could be partially oxidized to give it stronger mechanical strength. For example, dry oxidation of the porous silicon may be carried out at a low temperature of about 400° C. This results in oxidization of about 1-3 nm of the inner walls of the pores, thus preventing the structure of the porous silicon from changing under a subsequent high-temperature treatment.

As illustrated in FIG. 1B, the wafer of FIG. 1A may be processed to construct a full stratum of device layer 118 utilizing a portion of or a substantial majority of epitaxial layer 116. Device layer 118 could have full circuits including P type and N type transistors with their metal layers interconnection processed as known in semiconductor industry processes. Device layer 118 could include thru layer vias or preparatory structures for TLVs, which may have diameters of less than about 1 um, less than about 400 nm, less than about 200 nm, or less than about 100 nm. Processed wafer 120 could then be at least electrically and functionally tested (a die within processed wafer 120 may be said to be 'pretested') and made ready for the following steps. Processed wafer 120 may include device layer 118, low porosity layer 114, high porosity layer 112, and base wafer 110.

As illustrated in FIG. 1C, an additional embodiment is shown wherein a similar base wafer structure as illustrated in FIG. 1A may be processed with the addition of solid silicon layer 126. Solid silicon layer 126 may be disposed between low porosity layer 114 and high porosity layer 112. The structure of FIG. 1C could be fabricated using methods such as described in U.S. patent application Ser. No. 14/642,724 such as in respect to at least FIG. 30D. Second porous layer 3024 may correspond to low porosity layer 114, remaining monocrystalline layer 3022 may correspond to solid silicon layer 126, and cut double layer lower layer of porous silicon 3012 and upper layer of porous silicon 3014 may correspond to high porosity layer 112. Solid silicon layer 126 may have a thickness similar to layer epitaxial 116 and may have two main functions. First, solid silicon layer 126 helps stabilize the structure later-on as the structure is etched to allow pulling out of individual dies. And second it helps in providing a better interface to the pulling out apparatus which could use, for example, vacuum suction to provide the holding of the individual dies. The structure illustrated in FIG. 1C could be further processed to form a full stratum of device layer 118 as illustrated in FIG. 1B and so forth.

Figure 2A:
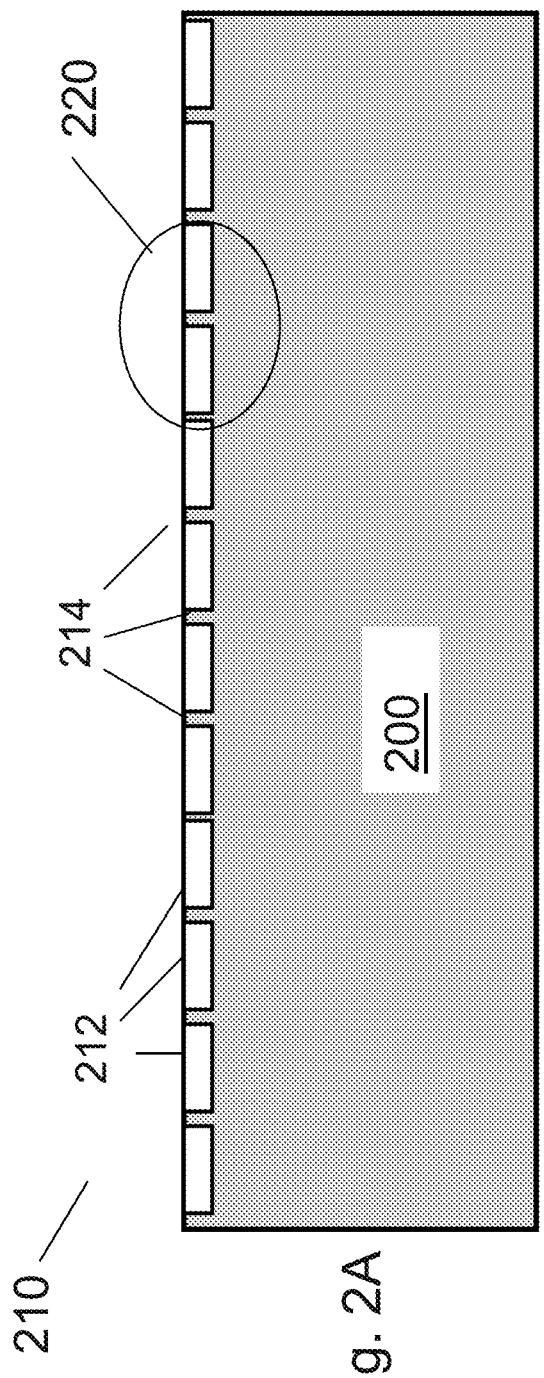
Figure 2B:
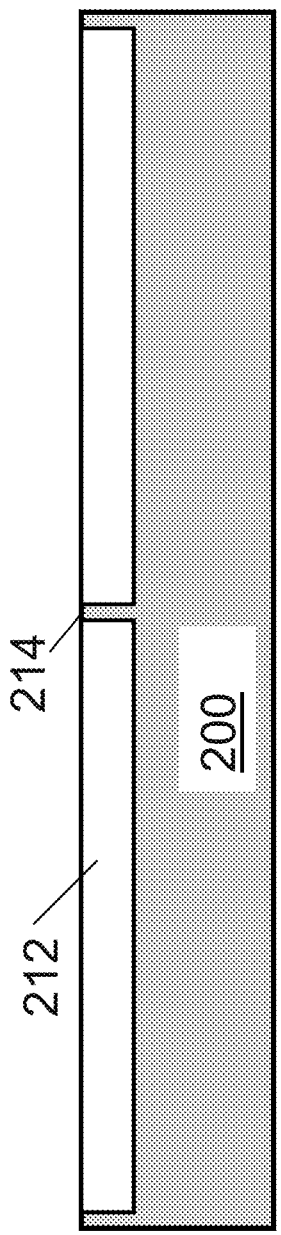

As illustrated in FIG. 2A, a customized carrier wafer 210 may be designed and formed to support the die being pulling out of, for example, processed wafer 120 in FIG. 1B. The customized carrier wafer 210 may be formed by etching die sized cavities 212 of about 1 micron depth (z direction) into a substrate wafer 200. The die size (x and y direction) may be defined according to the size of the dies on processed wafer 120. In most cases the dies are rectangular shaped with lengths and widths of a few mm up to about reticle size of 20×30 mm. As illustrated in FIG. 2B, which is an enlargement of bubble 220 of FIG. 2A, streets 214 may be disposed between the die sized cavities 212. Streets 214 could be few microns in width up to about 100 micron in width. Substrate wafer 200 may include a conventional monocrystalline silicon wafer, or may be formed from other materials, for example, such as aluminum, ceramic, and so on that may provide dimensional stability and bondability.

As illustrated in FIG. 2C, processed wafer 120 in FIG. 1B may be bonded onto customized carrier wafer 210 and may include alignment of streets 214 so that the processed dies of processed wafer 120 may be floating over die sized cavities 212 of customized carrier wafer 210 while the bonding may be done at the streets of both wafers. The actual processed circuits of device layer 118 are aligned to the die sized cavities 212 of the customized carrier wafer 210.

As illustrated in FIG. 2D, base wafer 110 of processed wafer 120 may be cut-off or cleaved from the bonded structure utilizing the cut porous layer high porosity layer 112.

As illustrated in FIG. 2E, structure 211 may be formed after cleaning the porous cut residues and etching the streets 132 of the remaining portion of processed wafer 120, thus leaving the dies 230 almost floating and lightly connected to the customized carrier wafer 210. Structure 211 may include custom carrier 210 with streets 214 lightly bonded to the edge of customized carrier wafer 120 dies 230. These dies 230 would include functional circuits from device layer 118 and support porous structure 114. Porous support structure 114 may have a thickness of about 6 to 20 microns.

In general a 6-20 micron thick silicon-porous silicon structure would be transparent enough to enable good detection of the individual die (such as dies 230) alignment marks for the following steps of precise die alignment. Alternatively the alignment marks could be exposed with an etch step. Selectivity for such a step would not be an issue as the alignment mark could be formed with metal layers while the 6-20 micron etch is of silicon and silicon oxide.

The dies 230 from the structure 211 could be pulled out for integration into a 3D IC structure. This step could be done one die at a time at a relatively slow throughput. An improved process was suggested in a paper titled "Simultaneous Cu—Cu and Compliant Dielectric Bonding for 3D Stacking of ICs," A. Jourdain et al, II TC07, and paper by A. Sigl et al, "Throughput Enhanced Flip-Chip to Wafer Bonding: The Advanced Chip to Wafer Bonding," ECS09; both incorporated herein by reference. They suggested a modification of the bonding process into two steps, first tacking the individual dies, and second, collectively bonding all stacked dies in a wafer-level bonding process. U.S. patents 8,597,980 and 8,697,542, incorporated herein by reference, also teach two step die to wafer bonding.

In a die to wafer bonding flow it could be desired to test the dies so that only good dies get bonded and also the target base circuit could be tested so bonding could be saved and be done to a good yielded circuit die(s) on either or both.

The die tacking could be done, for example, by using a glue, temporary copper to copper bonding or ultrasound techniques. Some glue would evaporate during the second step of the simultaneous bonding leaving no residue. Some of the tacking techniques do form metal to metal connection that would allow testing and rework to make sure all die to target base circuit connections are good before moving to the longer process for simultaneous permanent bonding of all dies.

For the known processes for metal to metal, copper to copper bonding, a short cycle of such processes could provide enough holding force to hold the die once placed until all the dies are placed, and then continue with the full permanent bonding performed for all dies on the wafer simultaneously. The short bonding/tacking should take less than a minute as it is done a die at a time, the permanent bonding could take more than 30 minutes as it is done to many dies such as full wafer populated structure simultaneously. Such bonding is presented in a paper by Y. H. Hu, et al., "Cu—Cu Hybrid Bonding as Option for 3D IC Stacking," IEEE IITC 2012, incorporated herein by reference.

Tacking using glue has been presented in a paper by J. Van Olmen, et al., "3D Stacked IC demonstrator using Hybrid Collective Die-to-Wafer Bonding with copper Through Silicon Vias (TSV)," IEEE 3DIC 2009, and in a paper by A Jourdain, et al., "Mechanical and electrical characterization of BCB as a bond and seal material for cavities housing (RF-)MEMS devices," J. Micromech. Microeng. 15 (2005), both incorporated herein by reference.

Tacking could be done using ultrasound for bonding. Ultrasound could be use for tacking and also for permanent bonding. Ultrasound bonding processing is presented in a paper by Yanhong Tian, "Investigation of ultrasonic copper wire wedge bonding on Au/Ni plated Cu substrates at ambient temperature," Journal of Materials Processing Technology (2008), incorporated herein by reference.

Equipment for picking a die and placing it on a wafer is available in the market by multiple vendors such as the FC 300 by SET, and similar equipment by EV Group. Both companies support two step bonding as been described herein.

These die bonders are designed to support fast placement of about 5-10 micron alignment accuracy or slower placement with alignment accuracy of about 1 micron.

While 1 micron accuracy is good enough for TSV based 3D IC system, a much higher precision would be desirable for monolithic 3D applications as been presented in U.S. patent application Ser. No. 14/642,724. An embodiment for such monolithic 3D applications is a three phase die to wafer bonding scheme.

The first step would be to lightly tack dies to the target wafer using existing die to wafer bonders such as the before mentioned FC 300. Such placement would be done with better than 10 micron accuracy.

The second step could use a precision die to wafer bonder to relocate the dies that had been placed at 10 micron accuracy to better than about 400 nm, or to better than about 100 nm, or better than about 50 nm, or better than about 10 nm. The step could be done following the completion of the above first step. This precise tacking could use a stronger type of tacking than the first step. Following this stronger tacking second step a sub-step of testing and rework as needed could be done to support a higher yielding process. The equipment for such small step of dies realignment is not currently available as standard industry equipment. A copending application details a possible construction of such precise high throughput die realignment equipment. This new type equipment would be leveraging the pre-placement of dies at about 10 micron accuracy so the realignment movement is for only about 10 micron or less, making it easier to achieve 100 nm precision at the end of such small movement and doing so at a good throughput.

For this second step of precise alignment of the individual dies, die level alignment could be used.

Once the second step is complete and all dies on the target wafer/substrate are placed at the required precision such as 100 nm, and possibly tested to validate good tacking connection, the third step of simultaneous bonding could commence.

In the third step all dies are permanently bonded at their precise position. Some bonding techniques would leverage the surface tension of the bonding surface to hold the dies at their precise location and to achieve a self-alignment to complete the third step of having all the die precisely and permanently boded to the target wafer.

Once all die had been bonded the wafer could be moved to further the process of 3D integration. A follow-on step could etch the low porosity layer 114. The porous layer etch rate is about 100,000 faster than the etch rate of solid (substantially non-porous) silicon. Low porosity layer 114 could be removed completely leaving the thin active circuits of device layer 118. Through layer vias could now be made to support the following steps of the 3D integration.

When the starting material structure used is the one illustrated in FIG. 1C, then the thinning process would start first by etching the top thin solid silicon layer 126 and then thick low porosity layer 114.

Figure 3:
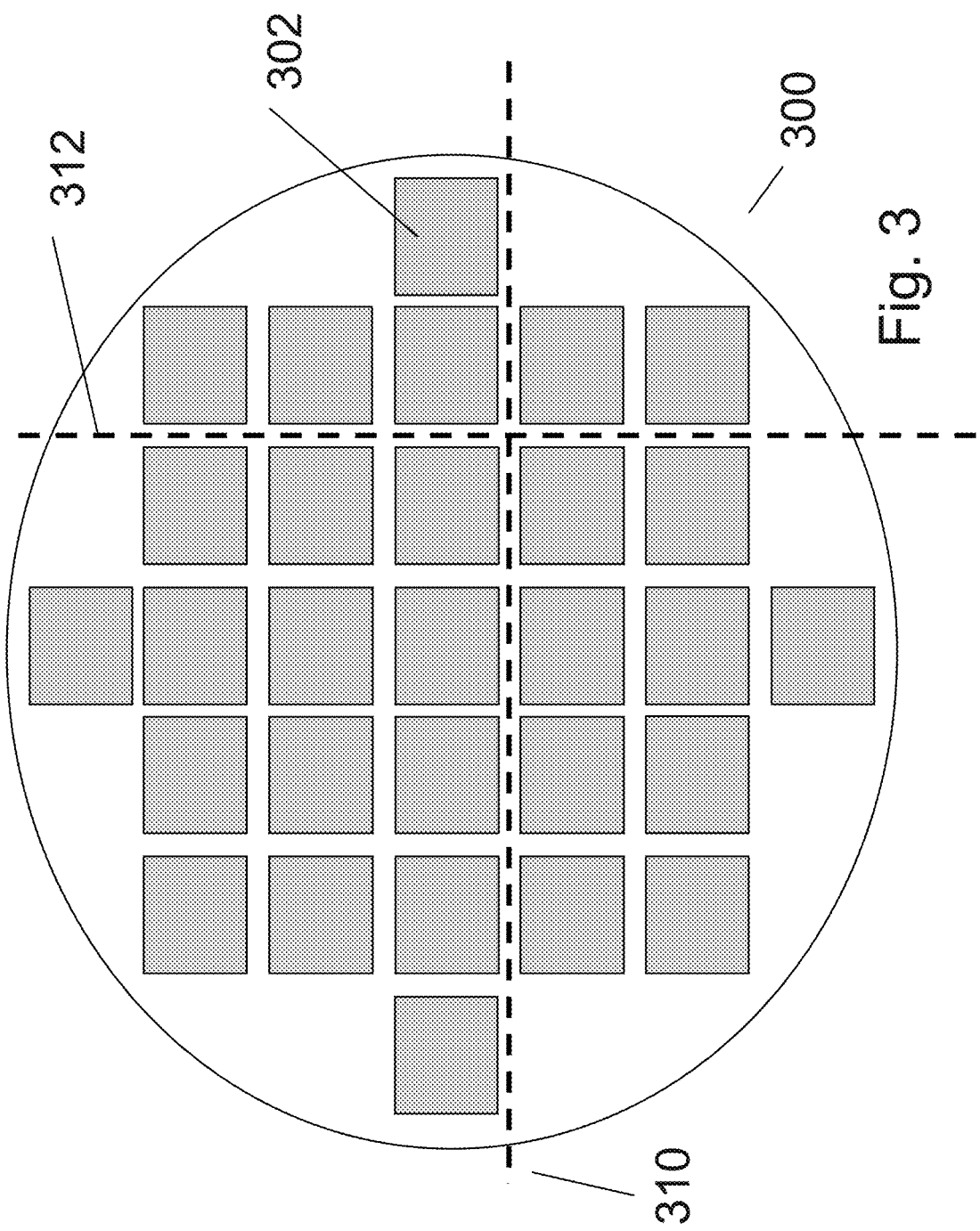
FIG. 3 is an exemplary illustration of an exemplary processed wafer with streets.

As illustrated in FIG. 3, exemplary processed wafer 300 may include multiple processed dies 302 and 'dicing streets' between dies such as horizontal street 310 and vertical street 312. As presented before for die to wafer bonding, the cutting of dies off exemplary processed wafer 310 would be done by etching rather than saw dicing. The etch would be relatively shallow at about 6-20 micron depth as the layers of multiple processed dies 302 was already thinned by cutting off the base wafer using, for example, the porous cutting layer 112. A typical wafer is circle (with or without a notch, etc.) with diameter size of about 150 mm to 300 mm, but may be greater than 300 mm. Typical dies are a rectangular size of 3×3 mm to 20×30 mm. Typical street widths are 50 micron to 200 micron.

As illustrated in FIG. 4, exemplary 4 dies 402 with streets for 'dicing'/etching such as horizontal street 410 and vertical street 412, and exemplary die alignment marks/structures 420. Typical die alignment mark/structure size could be 1-5 micron. The alignment area would be small relevant to the die size area so this additional overhead cost would be very small. The die alignment marks/structures 420 could be part of the metal layers of the active circuits of device layer 118 within each die 402. The die alignment marks/structures 420 could be formed by multiple metal layers. The die alignment marks/structures 420 could be formed close to the die edge 408, within about 20% of a die length/width, within about 10% of a die length/width, within about 5% of a die length/width.

The target wafer for which these dies would be precisely bonded to could have also die alignment marks. Those could be placed in the street area as those streets would not be etched or diced prior to the precise die bonding of step 2, especially if the design is that the die bonding would be toward the target bonding die edge. The target alignment marks/structures could correspond to the size of the die to be bonded if that die is smaller than the target die it is bonded to. If it is desired to bond smaller die to a target die and not toward the edge of that target die than it could be desired to have the target die alignment marks/structures inside the target die.

The target wafer could be processed with patterns according to the planed bonded dies so that all the areas which are not going to be covered with bonded dies would be protected from the planned die thinning etch step. Silicon nitride could be used for such or other layers with good etch selectivity to the underlying structure and to silicon and silicon oxide which would be etched for the thinning step.

After the thinning step, an oxide deposition and CMP planarization could be used to form a flat top surface for the follow-on 3D integration steps.

FIG. 5A illustrates some of the advantages of die level bonding. FIG. 5A illustrates a 3D semiconductor device 500 which includes a first die 502 and a smaller (by area) second die 504, where the second die 504 is bonded and connected to first die 502. Second die 504 may be bonded and connected to first die 502 utilizing the techniques and methods herein. Second die 504 may be electrically connected to first die 502 using thru layer vias, such as is described herein and in the incorporated references, and these thru layer vias may have diameters less than about 1 um, or less than about 400 nm, or less than about 200 nm, or less than about 100 nm, or less than about 40 nm. The area of first die 502 may be greater than the area of second die 504 by a least about 5%, or by at least about 10%, or buy at least about 25%, or by at least about 50%. Second die 504 may include alignment marks 520. FIG. 5A also illustrates a third die 506 bonded to the first die 502 and may be placed side by side to the second die 504 showing flexible heterogeneous integration of a 3D device.

FIG. 5B illustrates a side view of FIG. 5A's top view of a 3D device/system. While the first die 512 could have a thickness of 50 micron or even the original thickness of the original wafer plus processing (for example, about 775 um for a 300 mm wafer) the upper second die 514 and third die 516 could have a thickness of less than 10 micron or even thinner than 200 nm using the process described herein.

An advantage of the die level bonding is the flexibility with wafer size integration. Most modern fabs currently use larger than 280 mm wafers, commonly known as 300 mm or 12 inch wafers. In most cases it would be very hard to find a fab having a smaller wafer size being used for advance process nodes such as 28 nm or more advanced. Likewise it is very hard to find an old process nodes fab with 300 mm wafers. Old nodes such as 250 nm or older use smaller than 240 mm wafer size such wafer commonly known as 200 mm or 8 inch wafers. Smaller wafer size are also used for non-digital CMOS such as RF, high power, electro-optics and so forth. Most of the wafers that are non-silicon are only available with smaller than 240 mm wafer size. Die level 3D integration opens the ability to form 3D device with mixed technologies and overcomes the differing wafer diameter/size barrier.

An advantage of the die level bonding is the ability to pre-test the die before bonding and accordingly use what is commonly called Known Good Dies ("KGD"). In U.S. Pat. No. 9,142,55, incorporated herein by reference, a method for contact-less testing is described in reference to FIG. 24A-C. Such testing could be advantageous for very thin die bonding method as has been described herein.

While concepts in this patent application have been described with respect to 3D-ICs with two stacked device layers, those of ordinary skill in the art will appreciate that it can be valid for 3D-ICs with more than two stacked device layers. Additionally, some of the concepts may be applied to 2D ICs.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3D IC technology described herein may be found at least in FIG. 156 of U.S. Pat. No. 8,273,610, the contents of which are incorporated by reference.

Furthermore, some embodiments of the invention may include alternative techniques to build systems based on integrated 3D devices including techniques and methods to construct 3D IC based systems that communicate with other 3DIC based systems. Some embodiments of the invention may enable system solutions with far less power consumption and intercommunication abilities at lower power than prior art. These systems may be called 'Internet of Things", or IoT, systems, wherein the system enabler is a 3DIC device which may provide at least three functions: a sensing capability, a digital and signal processing capability, and communication capability. For example, the sensing capability may include a region or regions, layer or layers within the 3DIC device which may include, for example, a MEMS accelerometer (single or multi-axis), gas sensor, electric or magnetic field sensor, microphone or sound sensing (air pressure changes), image sensor of one or many wavelengths (for example, as disclosed in at least U.S. Pat. Nos. 8,283,215 and 8,163,581, incorporated herein by reference), chemical sensing, gyroscopes, resonant structures, cantilever structures, ultrasonic transducers (capacitive & piezoelectric). Digital and signal processing capability may include a region or regions, layer or layers within the 3D IC device which may include, for example, a microprocessor, digital signal processor, micro-controller, FPGA, and other digital land/or analog logic circuits, devices, and subsystems. Communication capability, such as communication from at least one 3D IC of IoT system to another, or to a host controller/nexus node, may include a region or regions, layer or layers within the 3D IC device which may include, for example, an RF circuit and antenna or antennas for wireless communication which might utilize standard wireless communication protocols such as G4, WiFi or Bluetooth, I/O buffers and either mechanical bond pads/wires and/or optical devices/transistors for optical communication, transmitters, receivers, codecs, DACs, digital or analog filters, modulators.

Energy harvesting, device cooling and other capabilities may also be included in the system. The 3DIC inventions disclosed herein and in the incorporated referenced documents enable the IoT system to closely integrate different crystal devices, for example a layer or layers of devices/transistors formed on and/or within mono or poly crystalline silicon combined with a layer or layers of devices/transistors formed on and/or within Ge, or a layer of layers of GaAs, InP, differing silicon crystal orientations, and so on. For example, incorporating the 3D IC semiconductor devices according to some embodiments of the invention as or within the IoT systems and mobile systems could provide superior IoT or mobile systems that could operate much more efficiently and for a much longer time than with prior art technology. The 3D IC technology herein disclosed provides a most efficient path for heterogeneous integration with very effective integration reducing cost and operating power with the ability to support redundancy for long field life and other advantages which could make such an IoT System commercially successful.

Alignment is a basic step in semiconductor processing. For most cases it is part of the overall process flow that every successive layer is patterned when it is aligned to the layer below it. These alignments could all be done to one common alignment mark, or to some other alignment mark or marks that are embedded in a layer underneath. In today's equipment such alignment would be precise to below a few nanometers and better than 40 nm or better than 20 nm and even better than 10 nm. In general such alignment could be observed by comparing two devices processed using the same mask set. If two layers in one device maintain their relative relationship in both devices—to few nanometers—it is clear indication that these layers are aligned each to the other. This could be achieved by either aligning to the same alignment mark (sometimes called a zero mark alignment scheme), or one layer is using an alignment mark embedded in the other layer (sometimes called a direct alignment), or using different alignment marks of layers that are aligned to each other (sometimes called an indirect alignment).

In this document, the connection made between layers of, generally, single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

While mono-crystalline silicon has been mentioned as a transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may or may not be stacked in a substantially vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. First silicon layers or transistor channels and second silicon layers or transistor channels may be may be substantially absent of semiconductor dopants to form an undoped silicon region or layer, or doped, such as, for example, with elemental or compound species that form a p+, or p, or p−, or n+, or n, or n− silicon layer or region. A heat removal apparatus may include an external surface from which heat transfer may take place by methods such as air cooling, liquid cooling, or attachment to another heat sink or heat spreader structure. Furthermore, raised source and drain contact structures, such as etch and epi SiGe and SiC, and implanted S/Ds (such as C) may be utilized for strain control of transistor channel to enhance carrier mobility and may provide contact resistance improvements. Damage from the processes may be optically annealed. Strain on a transistor channel to enhance carrier mobility may be accomplished by a stressor layer or layers as well.

In this specification the terms stratum, tier or layer might be used for the same structure and they may refer to transistors or other device structures (such as capacitors, resistors, inductors) that may lie substantially in a plane format and in most cases such stratum, tier or layer may include the interconnection layers used to interconnect the transistors on each. In a 3D device as herein described there may at least two such planes called tier, or stratum or layer.

In a 3D IC system stack, each layer/stratum may include a different operating voltage than other layers/stratum, for example, one stratum may have Vcc of 1.0v and another may have a Vcc of 0.7v. For example, one stratum may be designed for logic and have the appropriate Vcc for that process/device node, and another stratum in the stack may be designed for analog devices, and have a different Vcc, likely substantially higher in value—for example, greater than 3 volts, greater than 5 volts, greater than 8 volts, greater than 10 volts. In a 3D IC system stack, each layer/stratum may include a different gate dielectric thickness than other layers/stratum. For example, one stratum may include a gate dielectric thickness of 2 nm and another 10 nm. The definition of dielectric thickness may include both a physical definition of material thickness and an electrically 'effective' thickness of the material, given differing permittivity of the materials. In a 3D IC system stack, each layer/stratum may include different gate stack materials than other layers/stratum. For example, one stratum may include a HKMG (High k metal gate) stack and another stratum may include a polycide/silicon oxide gate stack. In a 3D IC system stack, each layer/stratum may include a different junction depth than other layers/stratum. For example, the depth of the junctions may include a FET transistor source or drain, bipolar emitter and contact junctions, vertical device junctions, resistor or capacitor junctions, and so on. For example, one stratum may include junctions of a fully depleted MOSFET, thus its junction depth may be defined by the thickness of the stratum device silicon to the vertical isolation, and the other stratum may also be fully depleted devices with a junction depth defined similarly, but one stratum has a thicker silicon layer than the other with respect to the respective edges of the vertical isolation. In a 3D IC system stack, each layer/stratum may include a different junction composition and/or structure than other layers/stratum. For example, one stratum may include raised source drains that may be constructed from an etch and epitaxial deposition processing, another stratum in the stack may have implanted and annealed junctions or may employ dopant segregation techniques, such as those utilized to form DSS Schottky transistors.

It should be noted that one of the design requirements for a monolithic 3D IC design may be that substantially all of the stacked layers and the base or substrate would have their respective dice lines (may be called scribe-lines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a single dicing step. There may be test structures in the streets between dice lines, which overall may be called scribe-lanes or dice-lanes. These scribe-lanes or dice-lanes may be 10 um wide, 20 um wide, 50 um wide 100 um wide, or greater than 100 um wide depending on design choice and die singulation process capability. The scribe-lanes or dice-lanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIG. 183A and 183B of same reference. One skilled in the art would recognize that the die seal can be passive or electrically active. On each 3D stack layer, or stratum, the electronic circuits within one die, that may be circumscribed by a dice-lane, may not be connected to the electronic circuits of a second die on that same wafer, that second die also may be circumscribed by a dice-lane. Further, the dice-lane/scribe-lane of one stratum in the 3D stack may be aligned to the dice-lane/scribe-lane of another stratum in the 3D stack, thus providing a direct die singulation vector for the 3D stack of strata/layers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by the appended claims.

We claim:
1. A 3D semiconductor device, the device comprising:
a first die comprising first transistors and a first interconnect; and
a second die comprising second transistors and a second interconnect,
wherein said first die is overlaid by said second die,
wherein said second die is bonded to said first die,
wherein said bonded comprises hybrid bonding,
wherein said second die comprises at least two alignment marks positioned close to a die edge of said second die,
wherein second die comprises an array of memory cells, and
wherein said first die comprises a control logic to control reads and writes to said array of memory cells.
2. The 3D semiconductor device according to claim 1,
wherein said first die has a first die area and said second die has a second die area,
wherein said first die area is at least 10% larger than said second die area.
3. The 3D semiconductor device according to claim 1,
wherein said first die is sourced from a first wafer with a diameter greater than 280 mm and said second die is sourced from a second wafer with a diameter less than 240 mm.
4. The 3D semiconductor device according to claim 1,
wherein said second die is aligned to said first die with less than 800 nm alignment error.
5. The 3D semiconductor device according to claim 1, further comprising:
a through second die via having a diameter of less than 400 nm.
6. The 3D semiconductor device according to claim 1,
wherein said second die is pretested.
7. A 3D semiconductor device, the device comprising:
a first die comprising first transistors and a first interconnect; and
a second die comprising second transistors and a second interconnect,
wherein said first die is overlaid by said second die,
wherein said second die is bonded to said first die,
wherein said bonded comprises hybrid bonding,
wherein said second die comprises at least two alignment marks positioned close to a die edge of said second die,
wherein second die comprises an array of memory cells,
wherein said first die comprises a control logic to control reads and writes to said array of memory cells, and
wherein said control logic comprises memory decoders.
8. The 3D semiconductor device according to claim 7,
wherein said first die is sourced from a first wafer with a first diameter greater than 280 mm and said second die is sourced from a second wafer with a second diameter less than 240 mm.
9. The 3D semiconductor device according to claim 7,
wherein said first die has a first die area and said second die has a second die area, and
wherein said first die area is at least 10% larger than said second die area.
10. The 3D semiconductor device according to claim 7, further comprising:
a third die directly overlaying said first die,
wherein said third die is pretested.
11. The 3D semiconductor device according to claim 7,
wherein said second die is aligned to said first die with less than 800 nm alignment error.
12. The 3D semiconductor device according to claim 7, further comprising:
a through second die via having a diameter of less than 400 nm.
13. A 3D semiconductor device, the device comprising:
a first die comprising first transistors and a first interconnect; and
a second die comprising second transistors and a second interconnect,
wherein said first die is overlaid by said second die,
wherein said first die has a first die area and said second die has a second die area,
wherein said first die area is at least 10% larger than said second die area,
wherein said second die is pretested,
wherein said second die comprises an array of memory cells,
wherein said first die comprises a control logic to control reads and writes to said array of memory cells,
wherein said second die is bonded to said first die,
wherein said bonded comprises hybrid bonding, and
wherein said second die comprises at least two alignment marks positioned close to a die edge of said second die.
14. The 3D semiconductor device according to claim 13, further comprising:
a third die directly overlaying said first die,
wherein said third die is pretested.
15. The 3D semiconductor device according to claim 13,
wherein said second die is aligned to said first die with less than 800 nm alignment error.
16. The 3D semiconductor device according to claim 13, further comprising:
a through second die via having a diameter of less than 400 nm.
17. The 3D semiconductor device according to claim 1,
wherein said control logic comprises memory decoders.

* * * * *